United States Patent
Chun et al.

(10) Patent No.: US 12,038,005 B2
(45) Date of Patent: Jul. 16, 2024

(54) MOVING PART, COMPRESSOR, AND MANUFACTURING METHOD THEREOF

(71) Applicant: SAMSUNG ELECTRONICS CO., LTD., Suwon-si (KR)

(72) Inventors: Jihwan Chun, Suwon-si (KR); Jiyoung Song, Suwon-si (KR); Youngdeog Koh, Suwon-si (KR); Kwangjoo Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/081,303

(22) Filed: Dec. 14, 2022

(65) Prior Publication Data

US 2023/0250821 A1 Aug. 10, 2023

Related U.S. Application Data

(63) Continuation of application No. PCT/KR2022/018207, filed on Nov. 17, 2022.

(30) Foreign Application Priority Data

Feb. 10, 2022 (KR) .......... 10-2022-0017737
May 16, 2022 (KR) .......... 10-2022-0059676

(51) Int. Cl.
*F04C 14/02* (2006.01)
*C23C 14/02* (2006.01)
(Continued)

(52) U.S. Cl.
CPC .......... *F04C 18/322* (2013.01); *C23C 14/022* (2013.01); *C23C 14/024* (2013.01);
(Continued)

(58) Field of Classification Search
CPC .... F04C 18/322; F04C 18/332; C23C 14/022; C23C 14/024; C23C 14/028; C23C 14/0605
See application file for complete search history.

(56) References Cited

U.S. PATENT DOCUMENTS 9,890,786 B2    2/2018  Tanaka et al.
2010/0159271 A1*  6/2010  Sugioka .............. F04B 27/0886
                                                        428/650
(Continued)

FOREIGN PATENT DOCUMENTS

JP        10-159767        6/1998
JP        2010-169071 A    8/2010
(Continued)

OTHER PUBLICATIONS

English Translation KR 20150100074 A (Year: 2015).*
International Search Report dated Feb. 24, 2023 for International Application No. PCT/KR2022/018207.

*Primary Examiner* — Shafiq Mian
(74) *Attorney, Agent, or Firm* — STAAS & HALSEY LLP

(57) ABSTRACT

A moving part of a compressor, a compressor including the moving part, and a method of manufacturing the moving part, the moving part including a base material having a polished surface and including a steel material; an adhesive layer arranged on the polished surface; and a coating layer including diamond-like carbon. The adhesive layer may be arranged between the base material and the coating layer and bond the coating layer to the base material, and the base material may include an etching-processed area having a plurality of microgrooves (MG) extending in a downward direction into the base material from the polished surface.

20 Claims, 11 Drawing Sheets

(51) Int. Cl.
  *C23C 14/06* (2006.01)
  *F04C 18/32* (2006.01)
  *F04C 18/332* (2006.01)

(52) U.S. Cl.
  CPC ........ *C23C 14/028* (2013.01); *C23C 14/0605* (2013.01); *F04C 18/332* (2013.01)

(56) References Cited

U.S. PATENT DOCUMENTS

2013/0202811 A1\* 8/2013 Choi ................... C23C 14/0641
  427/314
2017/0003057 A1 1/2017 Ueda et al.

FOREIGN PATENT DOCUMENTS

| | | |
|---|---|---|
| JP | 5132711 | 1/2013 |
| KR | 10-0923291 | 10/2009 |
| KR | 10-2013-0091611 A | 8/2013 |
| KR | 10-2015-0100074 | 9/2015 |
| KR | 10-2015-0100074 A | 9/2015 |
| KR | 20150100074 A \* | 9/2015 |
| KR | 20150100074 A \* | 9/2015 |
| KR | 10-2017-0086843 A | 7/2017 |
| KR | 10-0786103 | 10/2017 |

\* cited by examiner 24.5 N

MOVING PART, COMPRESSOR, AND MANUFACTURING METHOD THEREOF

CROSS-REFERENCE TO RELATED APPLICATIONS

This application is a continuation of International Application PCT/KR2022/018207, filed Nov. 17, 2022, and claims foreign priority to Korean applications 10-2022-0017737, filed Feb. 10, 2022, and 10-2022-0059676, filed May 16, 2022.

BACKGROUND

1. Field

The disclosure relates to a moving part, a compressor including the moving part, and a manufacturing method thereof.

2. Description of the Related Art

A compressor is a machine configured to receive power from a power generation device, such as a motor, a turbine, etc. and compress air, a refrigerant, or various other working gases to increase pressure. The compressor may be used in a wide variety of industries. For example, when the compressor is used for a refrigerant cycle, the compressor may convert a low-pressure refrigerant into a high-pressure refrigerant and provide the high-pressure refrigerant to a condenser.

The compressor may be classified into a reciprocating compressor in which a compression space where a working gas is sucked and discharged is formed between a piston and a cylinder such that the piston reciprocates in straight line to compress a refrigerant, a scroll compressor in which a compression space where a working gas is sucked and discharged is formed between an orbiting scroll and a fixed scroll such that the orbiting scroll orbits along the fixed scroll to compress a refrigerant, and a rotary compressor in which a compression space where a working gas is sucked and discharged is formed between a rolling piston, which rolls eccentrically, and a cylinder such that the rolling piston eccentrically rolls along an inner wall of the cylinder to compress a refrigerant.

The compressor may include a moving part which moves to compress a refrigerant, etc. The moving part may be driven in contact with other parts. A contact area between the moving part and other parts may require high hardness and low friction characteristics, considering damages and energy loss due to the friction.

SUMMARY

Aspects of embodiments of the disclosure will be set forth in part in the description which follows and, in part, will be apparent from the description, or may be learned by practice of the presented embodiments.

A moving part of a compressor according to an embodiment of the disclosure may have a polished surface and include a base material including a steel material.

The moving part of a compressor according to an embodiment of the disclosure may include an adhesive layer arranged on the polished surface.

The moving part of the compressor according to an embodiment of the disclosure may include a coating layer including diamond-like carbon.

The adhesive layer arranged between the base material and the coating layer and bonding the coating layer to the base material.

The base material may include an etching-processed area having a plurality of microgrooves extending in a downward direction into the base material from the polished surface.

A compressor according to an embodiment of the disclosure may include a compressing portion configured to compress a fluid and including a moving part which causes repetitive friction with at least one of other components.

The compressor according to an embodiment of the disclosure may include a driving motor configured to drive the compressing portion.

The compressor according to an embodiment of the disclosure may include a housing accommodating the compressing portion and the driving motor.

The moving part may include a base material having a polished surface and including a steel material.

The moving part may include an adhesive layer arranged on the polished surface.

The moving part may include a coating layer including diamond-like carbon.

The adhesive layer arranged between the base material and the coating layer and bonding the coating layer to the base material.

The base material may include an etching-processed area having a plurality of microgrooves extending in a downward direction into the base material from the polished surface.

A method of manufacturing a moving part of a compressor according to an embodiment of the disclosure may include forming a polished surface by polishing a surface of a base material including a steel material.

The method of manufacturing a moving part of a compressor according to an embodiment of the disclosure may include forming an etching-processed area having a plurality of microgrooves extending in a downward direction into the base material from the polished surface, by performing an etching process on the polished surface.

The method of manufacturing a moving part of a compressor according to an embodiment of the disclosure may include forming an adhesive layer on the etching-processed area.

The method of manufacturing a moving part of a compressor according to an embodiment of the disclosure may include forming a coating layer including diamond-like carbon on the adhesive layer.

Additional embodiments of the disclosure will be set forth in part in the description which follows and, in part, will be obvious from the description, or will be apparent from the disclosure.

BRIEF DESCRIPTION OF DRAWINGS

These and/or other embodiments of the disclosure will become apparent and more readily appreciated from the following description of the embodiments, taken in conjunction with the accompanying drawings of which.

DETAILED DESCRIPTION

Figure 1:
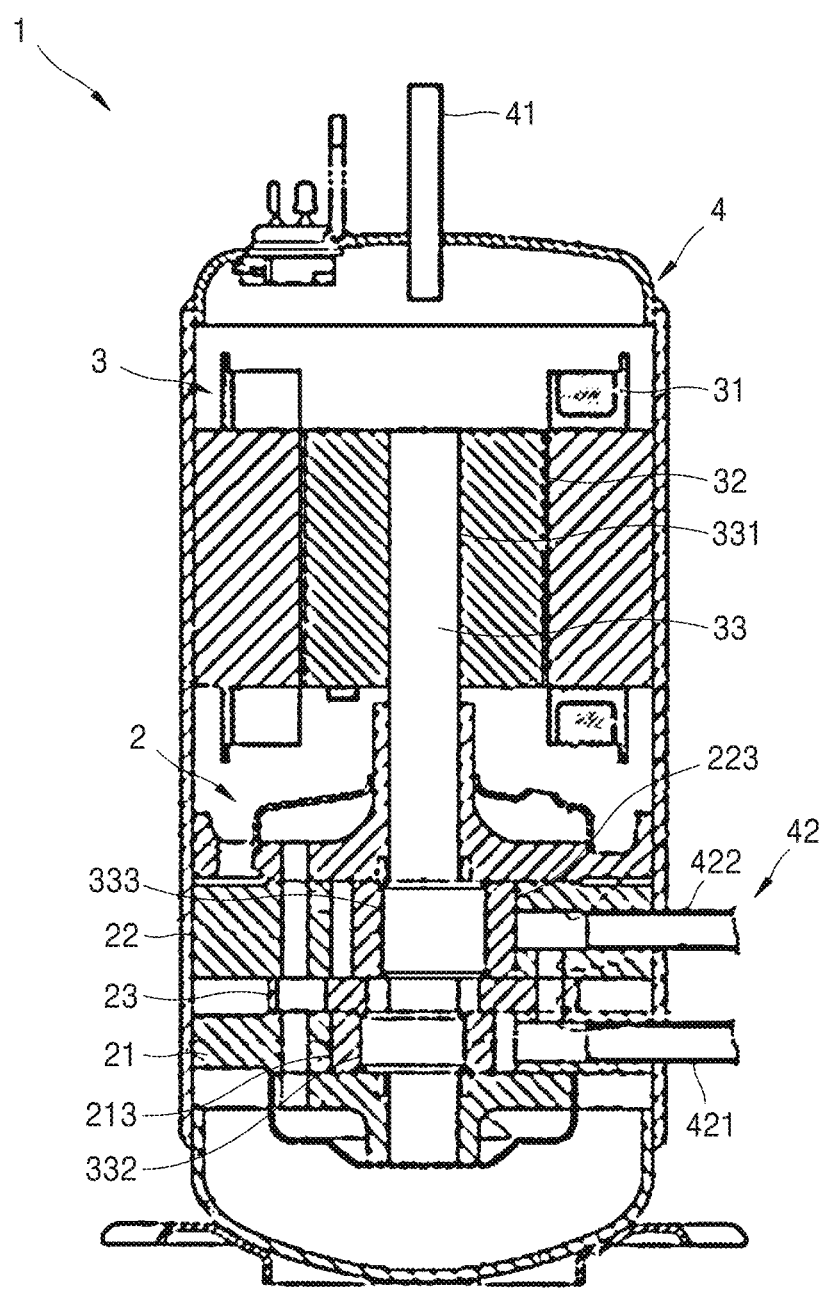
FIG. 1 is a schematic diagram of a compressor according to an embodiment of the disclosure.

Throughout the disclosure, the expression "at least one of a, b or c" indicates only a, only b, only c, both a and b, both a and c, both b and c, all of a, b, and c, or variations thereof.

Hereinafter, an embodiment of the disclosure is described in detail with reference to the descriptions of the accompanying drawings. In the drawings, like reference numerals or symbols denote like parts or components which perform substantially the same function.

While such terms as "first," "second," etc. may be used to describe various components, such components must not be limited by the above terms. The above terms are used only to distinguish one component from another. For example, a first component may be named as a second component, and similarly, a second component may be named as a first component without departing from the scope of the disclosure. The term "and/or" used herein is used to include combination of a plurality of relevant items, or any one item of a plurality of relevant items.

The terms used in the specification are merely used to describe an embodiment, and are not intended to limit the disclosure. An expression used in the singular encompasses the expression of the plural, unless it has a clearly different meaning in the context. Further, the terms such as "include" or "comprise" in the disclosure are used to specify the existence of features, numbers, processes, operations, components, parts recited in the detailed description, or combinations thereof, and thus should not be understood as pre-excluding the existence or possibility for addition of one or more other features, numbers, processes, operations, components, parts, or combinations thereof. In the drawings, like reference symbols denote like members which perform substantially the same function.

Embodiments of the disclosure may provide a moving part having a coating structure which has a low friction coefficient and ensures durability, a compressor including the moving part, and a method of manufacturing the same.

Figure 2:
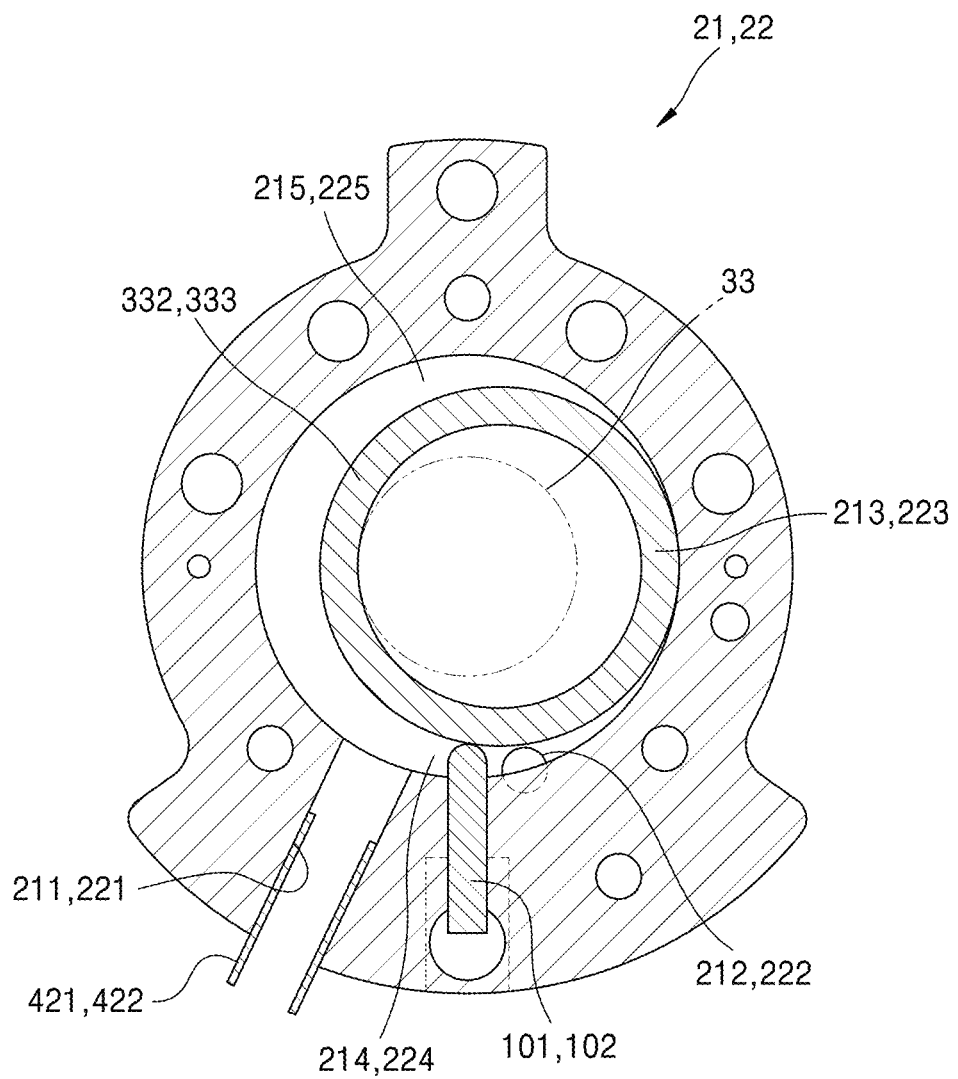
FIG. 2 is a cross-sectional diagram of a compression chamber of the compressor of FIG. 1 according to an embodiment of the disclosure.

FIG. 1 is a schematic diagram of a compressor 1 according to an embodiment of the disclosure, and FIG. 2 is a cross-sectional diagram of a compressing portion 2 of the compressor 1 of FIG. 1.

With reference to FIGS. 1 and 2, the compressor 1 according to an embodiment of the disclosure may include the compressing portion 2 configured to compress a fluid, a driving motor 3 configured to drive the compressing portion 2, and a housing 4 accommodating the compressing portion 2 and the driving motor 3. The compressor 1 may be a rotary compressor. The compressor 1 may be used in an air conditioner, and the fluid may be a refrigerant gas. However, the use of the compressor 1 is not limited thereto, and the compressor 1 may have various uses.

The driving motor 3 may be arranged inside the housing 4 and on the compressing portion 2. The driving motor 3 may include a stator 31, a rotor 32, and a rotation shaft 33 supporting the rotor 32 and rotating with respect to the housing 4.

The rotation shaft 33 may include a shaft body 331 supporting the rotor 32, and a first eccentric shaft 332 and a second eccentric shaft 333, which are arranged under the shaft body 331 and have a shaft center that is eccentric from a shaft center of the shaft body 331. The first eccentric shaft 332 and the second eccentric shaft 333 may be arranged to have a phase difference of 180 degrees in a circumferential direction of the rotation shaft 33.

The housing 4 may include a discharge portion 41 configured to discharge a high-pressure refrigerant gas compressed by the compressing portion 2 to the outside of the housing 4, and a suction portion 42 configured to suck a refrigerant gas from the outside of the housing 4. The suction portion 42 may include a first suction pipe 421 and a second suction pipe 422, which are interconnected with the compressing portion 2.

The compressing portion 2 may include a first cylinder 21 and a second cylinder 22, which are arranged vertically, and a partition 23 dividing the first cylinder 21 from the second cylinder 22.

The first cylinder 21 may include a first piston 213 supported by the first eccentric shaft 332 of the rotation shaft 33 and rotating along with the rotation shaft 33, and a first vane 101 elastically supported such that an end portion of the first vane 101 contacts with the first piston 213. An internal space of the first cylinder 21 may be divided into a first suction chamber 214 and a first compression chamber 215 by the first vane 101.

The second cylinder 22 may include a second piston 223 supported by the second eccentric shaft 333 of the rotation shaft 33 and rotating along with the rotation shaft 33, and a second vane 102 elastically supported such that an end portion of the second vane 102 contacts with the second piston 223. An internal space of the second cylinder 22 may be divided into a second suction chamber 224 and a second compression chamber 225 by the second vane 102.

The first cylinder 21 may include a first suction passage 211 to connect the first suction chamber 214 with the first suction pipe 421, and a first discharge outlet 212 to connect the first compression chamber 215 with the discharge portion 41.

The second cylinder 22 may include a second suction passage 221 to connect the second suction chamber 224 with the second suction pipe 422, and a second discharge outlet 222 to connect the second compression chamber 225 with the discharge portion 41.

In the compressor 1, the first eccentric shaft 332 and the second eccentric shaft 333 of the rotation shaft 33 may be rotated by rotation of the driving motor 3. In the process of rotation of the first and second eccentric shafts 332 and 333, the first and second pistons 213 and 223 supported by the first and second eccentric shafts 332 and 333, respectively may eccentrically rotate, and accordingly, suction, compression, and discharge of a refrigerant gas may be repeated in this order in the first cylinder 21 and the second cylinder 22. In the process of rotation of the first and second pistons 213 and 223, repetitive contact friction may occur between the first and second vanes 101 and 102, which divide the first and second suction chambers 214 and 224 from the first and second compression chambers 215 and 225, respectively, and the first and second pistons 213 and 223. Such repetitive contact friction may cause wear of a moving part 100, such as the first and second vanes 101 and 102, which leads to deteriorated durability of the compressor 1.

Considering the foregoing, the compressor 1 and the moving part 100 used therein according to an embodiment of the disclosure may provide a coating structure having low friction characteristics and wear-resistant characteristics. In an embodiment of the disclosure, the first and second vanes 101 and 102 are described as an example of the moving part 100; however, the disclosure is not limited thereto, and various other parts that generate repetitive friction in the process of driving the compressor 1 may be applicable.

Figure 3:
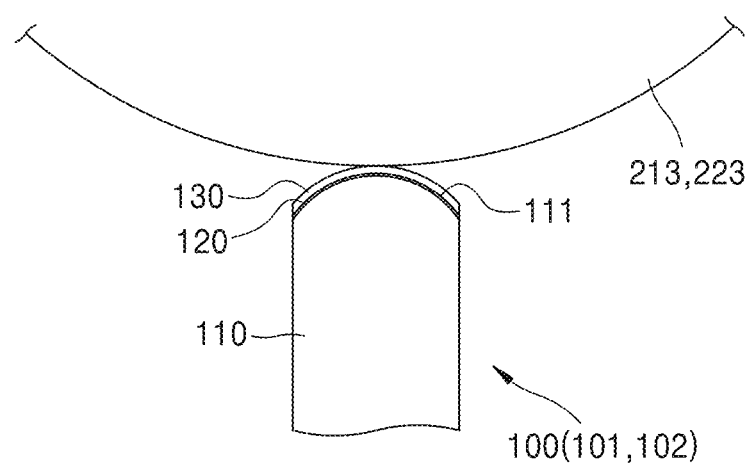
FIG. 3 illustrates a part of a compressor according to an embodiment of the disclosure.
Figure 4:
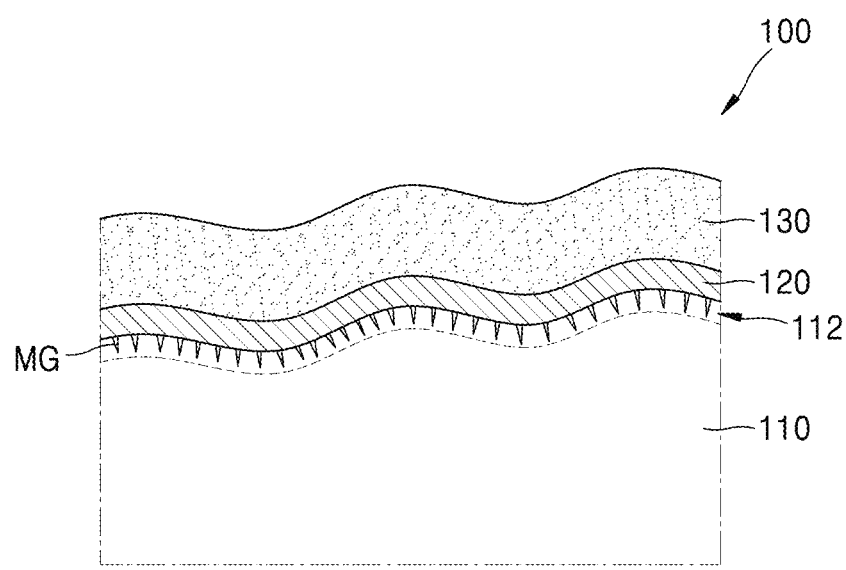
FIG. 4 illustrates a coating structure of the moving part of FIG. 3 according to an embodiment of the disclosure.

FIG. 3 illustrates a moving part 100 of the compressor 1 according to an embodiment of the disclosure, and FIG. 4 illustrates the coating structure of the moving part 100.

With reference to FIGS. 3 and 4, the moving part 100 may include a base material 110, an adhesive layer 120, and a coating layer 130. The moving part 100 may be arranged such that coating layer 130 contacts the first piston 213 or the second piston 223.

The base material 110 may include a steel material. The base material 110 may include stainless steel as an example of steel material. The base material 110 may include chrome (Cr) and iron (Fe).

The base material 110 may include an end portion having a circular shape. The end portion of the base material 110 may have a radius of 4 mm to about 6 mm.

The base material 110 may include a polished surface 111. The end portion of the base material 110 may include the polished surface 111. The polished surface 111 may be a smooth glossy surface. The polished surface 111 may have a centerline average roughness Ra from 0.03 μm to 0.1 μm, and a ten point average roughness Rz from 0.3 μm to 2.0 μm.

The base material 110 may include an etching-processed area 112 obtained by performing an etching process on the polished surface 111, considering the adhesion characteristics with the adhesive layer 120.

The etching-processed area 112 may include a plurality of microgrooves MG extending in a depth direction from the polished surface 111. During the etching process to form the microgrooves MG, foreign substances remaining on the polished surface 111 of the base material 110 may be removed. Accordingly, as foreign substances generated in the process of manufacturing, polishing, etc. are removed, the polished surface 111 of the base material 110 may be in a clean condition which facilitates adhesion with the adhesive layer 120.

A depth of the microgrooves MG may be 10 nm to 200 nm. The depth of the microgrooves MG may be an average depth of the plurality of microgrooves MG. When the depth of the microgrooves MG is less than 10 nm, the adhesion with the adhesive layer 120 may not be improved. When the depth is greater than 200 nm, the polished surface 111 of the base material 110 may be roughened by the prolonged etching process.

The etching-processed area 112 of the base material 110 may have an improved surface wettability. The surface wettability of the etching-processed area 112 may show different characteristics when the base material 110 does not include the etching-processed area 112.

Figure 5A:
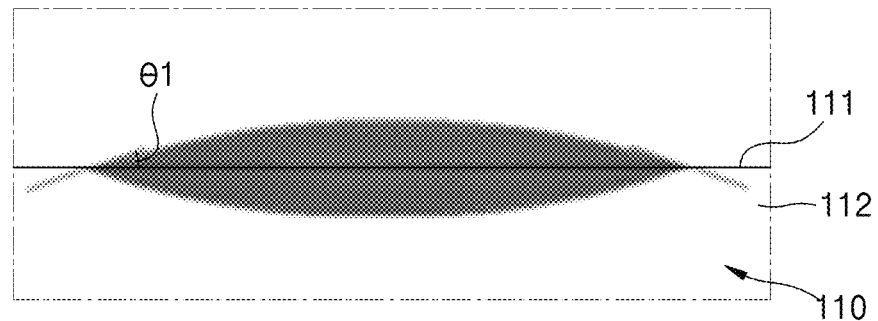
FIG. 5A is a diagram showing a contact angle when an etching process is performed on a polished surface of a base material according to an embodiment of the disclosure.
Figure 5B:
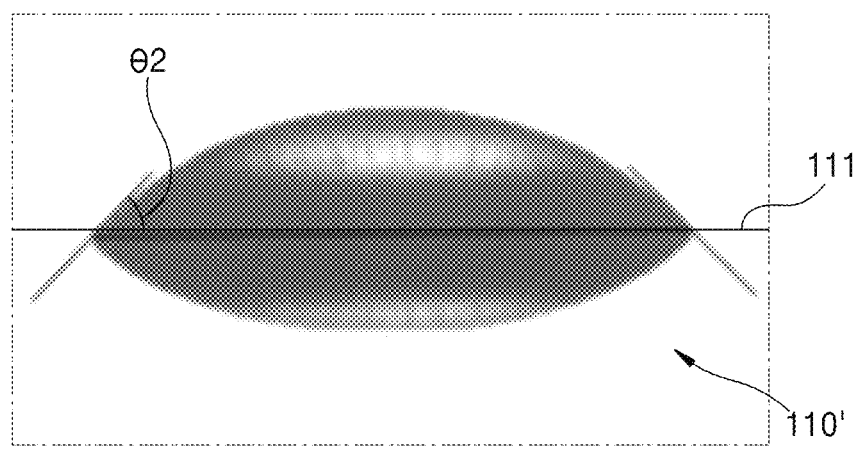
FIG. 5B is a diagram showing a contact angle when an etching process is not performed on a polished surface of a base material formed according to an embodiment of the disclosure.

FIG. 5A is a diagram showing a contact angle θ1 when the etching process is performed on the polished surface 111 of the base material 110, and FIG. 5B is a diagram showing a contact angle θ2 when the etching process is not performed on the polished surface 111 of a base material 110'. With reference to FIGS. 5A and 5B, the contact angle θ1 with water when the base material 110 includes the etching-processed area 112 because the etching process is performed on the polished surface 111 of the base material 110 may be less than the contact angle θ2 with water when the base material 110' does not include the etching-processed area 112 because the etching process is not performed on the polished surface 111 of the base material 110. As such, when the base material 110 includes the etching-processed area 112, the contact angle θ1 may become less. Accordingly, the adhesion between the polished surface 111 of the base material 110 and the adhesive layer 120 may be increased. The polished surface 111 of the base material 110 may be the same area as the etching-processed area 112.

The adhesive layer 120 may be arranged between the base material 110 and the coating layer 130 and bonds the coating layer 130 to the base material 110. The adhesive layer 120 may be arranged on a surface of the etching-processed area 112.

A hardness of the adhesive layer 120 may be less than a hardness of the coating layer 130 and a hardness of the base material 110. As the adhesive layer 120 having a relatively lower hardness is arranged between the base material 110 and the coating layer 130, an external shock applied to the coating layer 130 may be absorbed. Accordingly, breaking of the coating layer 130 may be prevented.

The adhesive layer 120 may include at least one of chrome (Cr) or iron (Fe). The adhesive layer 120 may include a part of elements constituting the base material 110. For example, when the base material 110 is stainless steel including Cr and Fe, the adhesive layer 120 may include at least one of Cr or Fe.

A thickness of the adhesive layer 120 may be less than a thickness of the coating layer 130. For example, the thickness of the coating layer 130 may be 1.0 μm to 3.0 μm, and the thickness of the adhesive layer 120 may be 0.3 μm to 0.9 μm. When the thickness of the adhesive layer 120 is less than 0.3 μm, peeling or damage of the coating layer 130 may occur.

The coating layer 130 may be arranged on the adhesive layer 120. The coating layer 130 may have wear-resistant characteristics and low friction characteristics. The coating layer 130 may have a hardness greater than a hardness of the base material 110.

The coating layer 130 may include diamond-like carbon. To lower the friction coefficient, the coating layer 130 may further include silicon (Si).

Figure 6:
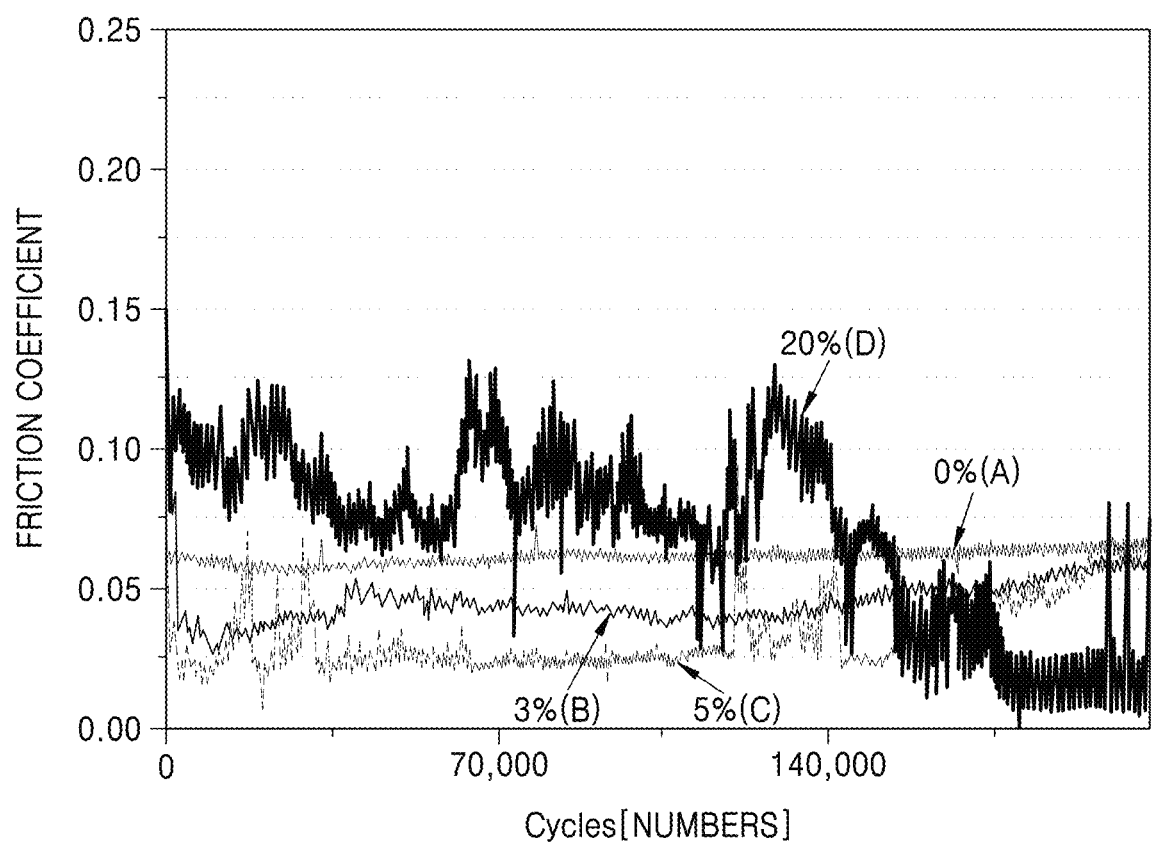
FIG. 6 is a graph showing friction test results including a relation between a friction coefficient and a concentration of silicon included in a coating layer in a moving part according to an embodiment of the disclosure.

FIG. 6 is a graph showing friction test results including a relation between a friction coefficient and a concentration of silicon included in the coating layer 130 in the moving part 100 according to an embodiment of the disclosure. One cycle was defined by reciprocating friction occurring when an end portion of the moving part 100 contacts the piston, and the friction test was conducted under the conditions that the weight applied to the end portion of the moving part 100 is 5 N to 50 N, and the revolution speed of the cylinder is 50 RPM to 300 RPM.

With reference to FIG. 6, when a coating layer (A) does not include silicon but includes diamond-like carbon, a friction coefficient of the coating layer (A) was 0.06 to 0.10. When a coating layer (B) and a coating layer (C) include diamond-like carbon and silicon and have silicon concentration of 5%, friction coefficients of the coating layers (B and C) were less than the friction coefficient of the coating layer (A) which does not include silicon. For example, when the silicon concentration of the coating layers (B and C) is less than or equal to 5%, an average friction coefficient of the coating layers (B and C) was less than or equal to 0.06 in a section where the reciprocating friction number is less than or equal to 140,000. When the silicon concentration of the coating layer (B) is less than or equal to 3%, the fluctuation range of friction coefficient was within 0.03 in a section where the reciprocating friction number is less than or equal to 140,000. When the silicon concentration of the coating layers (C and D) is greater than 3%, the fluctuation range of friction coefficient increased drastically in a section where the reciprocating friction number is less than or equal to 140,000. For example, when the silicon concentration of the coating layer (C) is 5%, the fluctuation range of friction coefficient is 0.08, which is 2.66 times greater than 0.03 that is the fluctuation range of friction coefficient when the silicon concentration of the coating layer (B) is 3%. When the silicon concentration of the coating layer (D) is 20%, the fluctuation range of friction coefficient is 0.13, which is 4.33 times greater than 0.03 that is the fluctuation range of friction coefficient when the silicon concentration of the coating layer (B) is 3%.

The silicon concentration of the coating layer 130 may be determined by considering the friction coefficient change according to the silicon concentration.

For example, the silicon concentration may be determined by considering the reciprocating friction number and friction coefficient of the coating layer 130. For example, the silicon concentration may be less than or equal to 5% such that the average friction coefficient of the coating layer 130 is less than or equal to 0.06 in a section where the reciprocating friction number of the coating layer 130 is less than 140,000.

For example, the silicon concentration of the coating layer 130 may be determined by considering the reciprocating friction number, friction coefficient, and fluctuation range of the friction coefficient of the coating layer 130. For example, the silicon concentration may be less than or equal to 3% such that the average friction coefficient of the coating layer 130 is less than or equal to 0.06, and the fluctuation range of the friction coefficient is less than or equal to 0.03 in a section where the reciprocating friction number of the coating layer 130 is less than 140,000.

The moving part 100 having a coating structure according to the aforementioned configuration may have improved wear-resistance and low friction characteristics. Moreover, as the coating layer 130 according to an embodiment of the disclosure has a silicon concentration within a certain range, stability of friction characteristics may be secured.

In addition, as the moving part 100 according to an embodiment of the disclosure includes the etching-processed area 112, adhesion between the adhesive layer 120 and the coating layer 130 may be induced, and the overall hardness of the coating structure may be increased.

Figure 7:
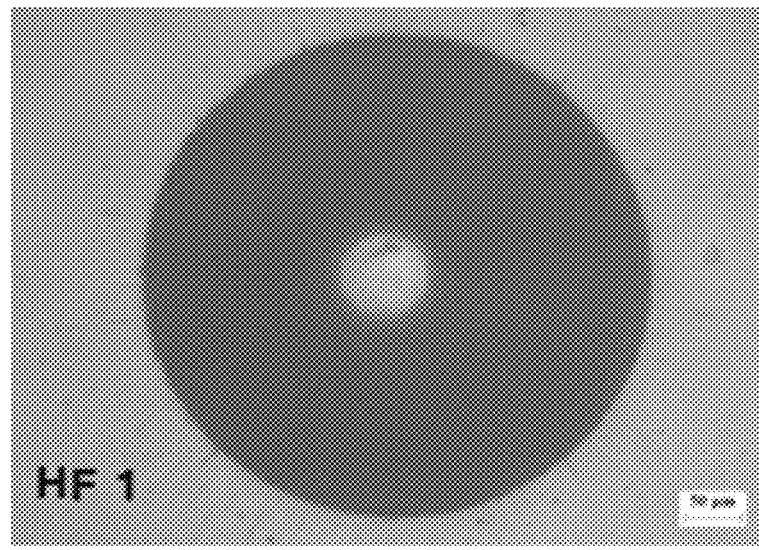
FIG. 7 is a diagram showing Rockwell measurement results of a moving part according to an embodiment of the disclosure.

FIG. 7 is a diagram showing Rockwell measurement results of the moving part 100 according to an embodiment of the disclosure. With reference to FIG. 7, the moving part 100 in which the adhesive layer 120 and the coating layer 130 are arranged in this order on the polished surface 111 of the base material 110 including the etching-processed area 112 has an increased Rockwell hardness value. For example, after measuring Rockwell indentation by C scale with respect to the etching-processed area 112 of the base material 110 with or without etching-processed area 112 under the same condition, the result shows that the Rockwell hardness of the moving part 100 in which the adhesive layer 120 and the coating layer 130 are arranged in this order on the polished surface 111 of the base material 110 including the etching-processed area 112 is measured to be HF1 as illustrated in FIG. 7, but the Rockwell hardness of the moving part 100 in which the adhesive layer 120 and the coating layer 130 are arranged in this order on the polished surface 111 of the base material 110' not including the etching-processed area 112 is measured to be HF3 or higher.

Figure 8:
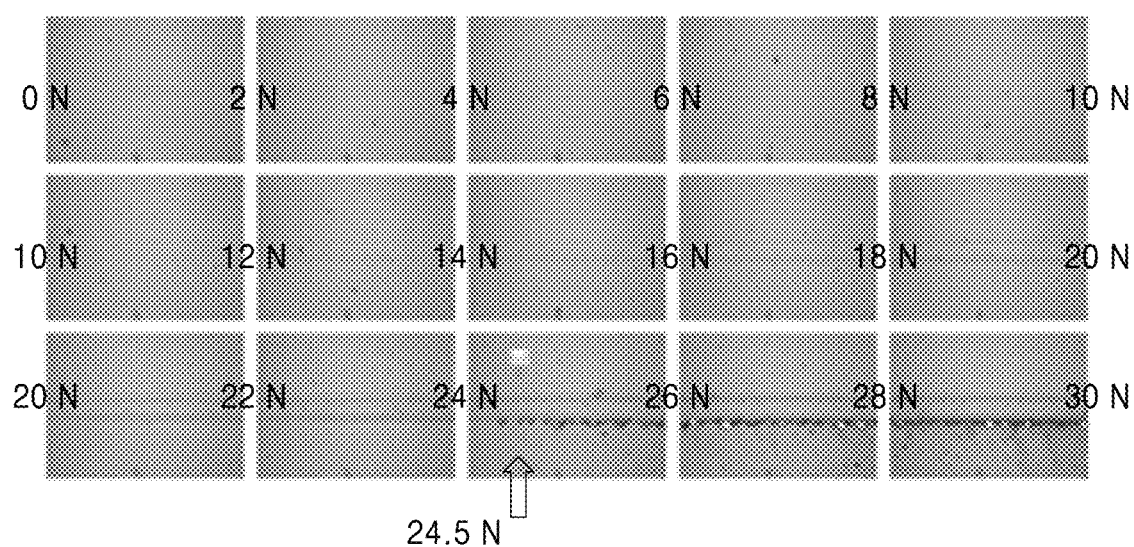
FIG. 8 is a diagram showing results of experiment regarding scratch-resistant characteristics of a moving part according to an embodiment of the disclosure.

FIG. 8 is a diagram showing results of experiment regarding scratch-resistant characteristics of the moving part 100 according to an embodiment of the disclosure. In FIG. 8, the force applied to the surface of the moving part 100 was gradually increased, and the measurement results are shown by the unit of 2 N. With reference to FIG. 8, the moving part 100 in which the adhesive layer 120 and the coating layer 130 are arranged in this order on the base material 110 including the etching-processed area 112 has increased scratch-resistant characteristics. For example, after conducting scratch tests on the surface of the coating layer 130 of the moving part 100, the coating layer 130 did not break up to 24 N, but started to break around 24.5 N. That is, the coating layer 130 did not break up until a force greater than 24.5 was applied.

As such, when the base material 110 includes the etching-processed area 112, the hardness and scratch-resistance of the moving part 100 are improved, and from this, it is indirectly understood that the adhesion of the coating layer 130 to the base material 110 is also improved.

Figure 9:
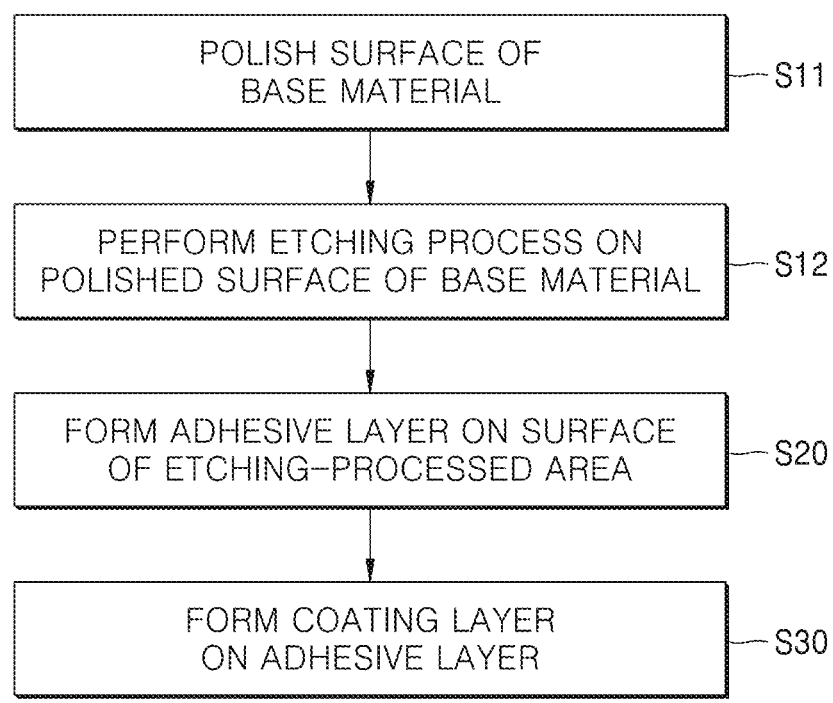
FIG. 9 is a flowchart of a method of manufacturing a moving part according to an embodiment of the disclosure.

FIG. 9 is a flowchart of a method of manufacturing the moving part 100 according to an embodiment of the disclosure.

With reference to FIGS. 4 and 9, a surface of the base material 110 may be polished (S11). For example, a surface of an end portion of the base material 110 may be polished. In the polishing process, an end portion of the base material 110 may be in contact with a polishing wheel (not shown) rotating at a certain speed. The polishing wheel in contact with the base material 110 may rotate at over 60 rpm. By the contact with the polishing wheel, the base material 110 may have the polished surface 111. The polished surface 111 may have a centerline average roughness Ra from 0.03 μm to 0.1 μm, and a ten point average roughness Rz from 0.3 μm to 2.0 μm.

By performing an etching process on the polished surface 111 of the base material 110, the etching-processed area 112 may be formed (S12). By the etching process, the etching-processed area 112 activated to a certain depth from the polished surface 111 of the base material 110 may be formed.

A physical vapor deposition method may be used in the forming of the etching-processed area 112. For example, by using a linear ion source (LIS) in the forming of the etching-processed area 112, an ion beam of which ions have linearity may be formed. The using of the LIS may last for about 60 minutes to about 180 minutes. In the using of the LIS, an inert gas may be injected into a chamber (not shown), and a certain voltage may be applied to an ion generator (or an ion gun) (not shown). For example, argon (Ar) gas may be injected at 50 cm$^3$/min (sccm: standard cubic centimeters per minute) to 100 cm$^3$/min, and a voltage of 1500±500 V may be applied to an ion gun.

In the etching process, the etching-processed area 112 having a plurality of microgrooves MG extending to a certain depth from the polished surface 111 may be formed in the base material 110. In the etching process, remaining foreign substances on the polished surface 111 may be removed, and a surface wettability may be improved by the plurality of microgrooves MG. The surface of the etching-processed area 112 may have a lower contact angle with water t than that of the surface before the etching process is performed thereon.

The adhesive layer 120 may be formed on the surface of the etching-processed area 112 (S20). In the forming of the adhesive layer 120, at least one metal material of chrome or iron may be deposited on the surface of the etching-processed area 112.

For example, in the forming of the adhesive layer 120, chrome (Cr) may be injected into a chamber in a vacuum state at 50 cm$^3$/min to 100 cm$^3$/min, and power of 300 W to 2900 W may be applied thereto within a voltage range of 500 V to 2900 V and a current range of 0.1 A to 1.0 A. The forming of the adhesive layer 120 may be performed for about 240 minutes to about 480 minutes.

By the adhesive layer 120, the coating layer 130, which is to be deposited in a subsequent operation, may be bonded to the base material 110. The hardness of the adhesive layer 120 may be less than the hardness of the coating layer 130 and the hardness of the base material 110. As the adhesive layer 120 having a relatively less hardness is arranged between the base material 110 and the coating layer 130, an external shock applied to the coating layer 130 may be absorbed by the adhesive layer 120. Accordingly, breaking of the coating layer 130 may be prevented.

The adhesive layer 120 may include at least one of chrome or iron. The thickness of the adhesive layer 120 may be less than the thickness of the coating layer 130. For example, the thickness of the coating layer 130 may be 1.0 μm to 3.0 μm, and the thickness of the adhesive layer 120 may be 0.3 μm to 0.9 μm. By controlling deposition time, etc., of the adhesive layer 120, the thickness of the adhesive layer 120 may be adjusted.

Then, the coating layer 130 may be formed on the adhesive layer 120 (S30). The coating layer 130 may have a hardness greater than a hardness of the base material 110. The coating layer 130 may include diamond-like carbon.

The physical vapor deposition method may be used in the forming of the coating layer 130. Ion deposition may be performed in the forming of the coating layer 130. The ion deposition is a method for forming a thin film by ionizing a hydrocarbon gas by plasma discharge and acceleratedly colliding a resulting gas with a substrate, such as a base material, etc. By spraying an ion beam on the base material 110 on which the adhesive layer 120 is arranged, the coating layer 130 may be formed on the adhesive layer 120. The hydrocarbon gas may include acetylene ($C_2H_2$), methane ($CH_4$), or benzene ($C_6H_6$).

For example, the forming of the coating layer 130 may be performed for about 360 minutes to about 510 minutes, and include injecting acetylene ($C_2H_2$) into a chamber at 10 cm$^3$/min to 50 cm$^3$/min and applying a voltage of 1500±500 V to an ion gun.

To decrease a friction coefficient of the coating layer 130, silicon (Si) may be injected into the chamber in the forming the coating layer 130. For example, silicon may be injected in a gaseous condition.

The silicon concentration of the coating layer 130 may be adjusted considering the friction coefficient, coating stability, or peeling characteristics of the coating layer 130. By controlling the content of silicon included in the gas injected into the chamber, the silicon concentration of the coating layer 130 may be adjusted.

The silicon concentration may be determined by considering the reciprocating friction number and average friction coefficient of the coating layer 130. For example, the silicon concentration in the coating layer 130 may be less than or equal to 5% such that the average friction coefficient of the coating layer 130 is less than or equal to 0.06 in a section where the reciprocating friction number of the coating layer 130 is less than 140,000.

The silicon concentration of the coating layer 130 may be determined by considering the reciprocating friction number, average friction coefficient, and fluctuation range of the friction coefficient of the coating layer 130. For example, the silicon concentration may be less than or equal to 3% such that the average friction coefficient of the coating layer 130 is less than or equal to 0.06, and the fluctuation range of the friction coefficient is less than or equal to 0.03 in a section where the reciprocating friction number of the coating layer 130 is less than 140,000.

The process temperature may be set higher than room temperature in the forming of the coating layer 130. For example, the process temperature may be higher than or equal to 100° C. and less than or equal to 300° C. in the forming of the coating layer 130. By setting the process temperature at 100° C. to 300° C. in the forming of the coating layer 130, discoloration of the coating layer 130 may be prevented.

Figure 10:
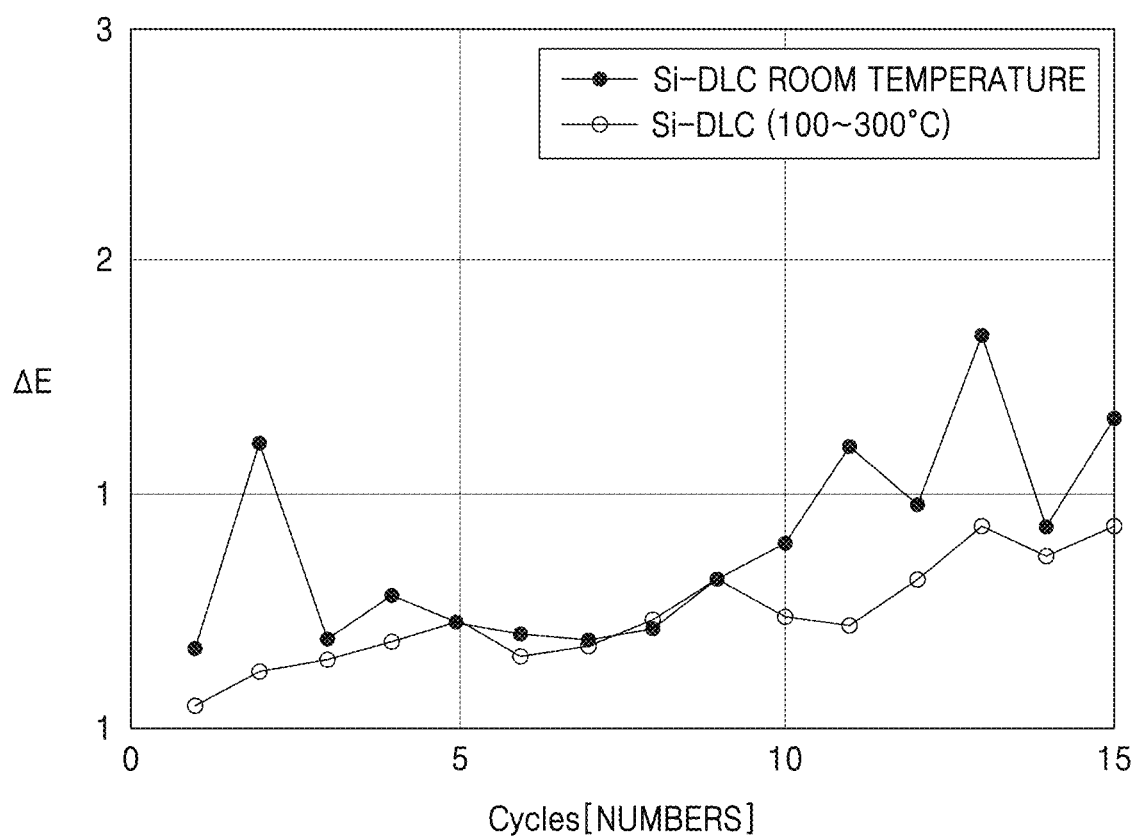
FIG. 10 is a graph showing a color difference according to a formation temperature of a coating layer of a moving part formed according to an embodiment of the disclosure.

FIG. 10 is a graph showing a color difference ΔE according to a formation temperature of the coating layer 130 of the moving part 100. FIG. 10 shows a result of test conducted for 15 cycles (24 hours per 1 cycle) and the color difference represents a distance between positions of two colors in a color space.

The color difference ΔE according to a process temperature when forming the coating layer 130 having the same silicon concentration may be identified in FIG. 10. When the color difference ΔE is greater than 1.0, it may be interpreted as discoloration of the color difference ΔE has occurred.

For example, the color difference ΔE of the coating layer 130 formed at 100° C. to 300° C. was less than or equal to 1.0 in every cycle. On the contrary, the color difference ΔE of the coating layer 130 formed at room temperature was greater than 1.0 in some cycles. Based on the foregoing, it is learned that discoloration of the coating layer 130 deposited at 100° C. to 300° C. has not occurred for 15 cycles. On the other hand, the coating layer 130 deposited at room temperature was more vulnerable to discoloration, compared to the coating layer 130 deposited at 100° C. to 300° C. From this, it is confirmed that the coating stability of the moving part 100 was improved when the process temperature of the coating layer 130 was set from 100° C. to 300° C.

A moving part, a compressor including the moving part, and a manufacturing method thereof according to embodiments of the disclosure may provide a coating structure with having a low friction coefficient and improved durability by performing a surface process on a base material and forming an adhesive layer of a certain material and a coating layer on the surface-processed base material in this order.

A moving part of a compressor according to an embodiment of the disclosure includes: a base material having a polished surface and including a steel material; an adhesive layer arranged on the polished surface; and a coating layer including diamond-like carbon. The adhesive layer may be arranged between the base material and the coating layer and bond the coating layer to the base material, wherein the base material includes an etching-processed area including a plurality of microgrooves extending in a downward direction into the base material from the polished surface.

A depth of the microgrooves may range from 10 nm to 200 nm.

A wettability of the polished surface having the etching-process surface has different characteristics than a wettability of a polished surface of the base material that does not include the etching-processed area.

The base material may include stainless steel (SUS), a centerline average roughness (Ra) of the polished surface may range from about 0.03 µm to about 0.1 µm, and a ten point average roughness (Rz) of the polished surface may range from about 0.3 µm to about 2.0 µm.

The coating layer may further include silicon.

A concentration of the silicon may be less than or equal to 5% such that an average friction coefficient of the coating layer is less than or equal to 0.06 in a section where a reciprocating friction number of the coating layer is less than or equal to 140,000.

The concentration of the silicon may be less than or equal to 3% such that a fluctuation range of a friction coefficient of the coating layer is less than or equal to 0.03.

The adhesive layer may include at least one of chrome (Cr) or iron (Fe).

A thickness of the adhesive layer may be less than a thickness of the coating layer.

The thickness of the coating layer may be 1.0 µm to 3.0 µm, and the thickness of the adhesive layer may be 0.3 µm to 0.9 µm.

The hardness of the adhesive layer may be less than the hardness of the base material and the hardness of the coating layer.

A compressor according to an embodiment of the disclosure includes: a compressing portion configured to compress a fluid and including a moving part which generates repetitive friction with at least one other component; a driving motor configured to drive the compressing portion; and a housing accommodating the compressing portion and the driving motor, wherein the moving part comprises: a base material having a polished surface and including a steel material; an adhesive layer arranged on the polished surface; and a coating layer including diamond-like carbon. The adhesive layer may be arranged between the base material and the coating layer and bond the coating layer to the base material, wherein the base material comprises an etching-processed area having a plurality of microgrooves extending in a downward direction into the base material from the polished surface.

A method of manufacturing a moving part of a compressor according to an embodiment of the disclosure includes: forming a polished surface by polishing a surface of a base material including a steel material; forming an etching-processed area including a plurality of microgrooves extending to a downward direction into the base material from the polished surface by performing an etching process on the polished surface; forming an adhesive layer on the etching-processed area; and forming a coating layer including diamond-like carbon on the adhesive layer.

The base material may include stainless steel (SUS), a centerline average roughness (Ra) of the polished surface may range from about 0.03 µm to about 0.1 µm, and a ten point average roughness (Rz) of the polished surface may range from about 0.3 µm to about 2.0 µm.

The forming of the etching-processed area may include: generating a plasma by injecting argon gas into a chamber containing the base material and applying a certain voltage into the chamber; and forming a plurality of microgrooves having a depth of about 10 nm to about 200 nm from a polished surface of the base material by performing an etching process on the polished surface by the plasma.

The forming of the adhesive layer may include depositing at least one metal material including at least one of chrome or iron on the etching-processed area.

The forming of the coating layer may include ionizing a hydrocarbon gas by plasma discharge to form the coating layer on the surface of the adhesive layer.

The forming of the coating layer may include forming the coating layer including diamond-like carbon and silicon on a surface of the adhesive layer by adding silicon.

In the forming of the coating layer, a process temperature may be greater than or equal to 100° C. and less than or equal to 300° C.

A concentration of the silicon in the coating layer may be less than or equal to 3%.

To promote understanding of the disclosure, reference has been made to the embodiments illustrated in the drawings, and specific language has been used to describe these embodiments. However, no limitation of the scope of the disclosure is intended by this specific language, and the disclosure should be construed to encompass all components that would normally occur to one of ordinary skill in the art.

The particular implementations shown and described herein are illustrative examples of embodiment and are not intended to otherwise limit the scope of the disclosure in any way. For the sake of brevity, conventional electronics, control systems, software development and other functional aspects of the systems may not be described in detail. Furthermore, the connecting lines, or connectors shown in the various FIGS. presented are intended to represent exemplary functional relationships and/or physical or logical couplings between the various components. It should be noted that many alternative or additional functional relationships, physical connections or logical connections may be present in a practical device. Moreover, no item or component is essential to the practice of embodiment unless the component is specifically described as "essential" or "critical." The terms "comprising," "including," etc. used herein should be construed as having an open end in describing the disclosure.

The use of the terms "a" and "an" and "the" and similar referents in the context of describing an embodiment (especially in the context of the following claims) are to be construed to cover both the singular and the plural. Furthermore, recitation of ranges of values herein are merely intended to serve as a shorthand method of referring individually to each separate value falling within the range, unless otherwise indicated herein, and each separate value is incorporated into the specification as if it were individually recited herein. Also, the steps of all methods described herein can be performed in any suitable order unless otherwise indicated herein or otherwise clearly contradicted by context. The disclosure is not limited to the described order of the steps. The use of any and all examples, or exemplary language (e.g., "such as") provided herein, is intended merely to better illuminate an embodiment and does not pose a limitation on the scope of embodiment unless otherwise claimed. In addition, it will be understood by those skilled in the art that various changes in form and details may be made therein without departing from the spirit and scope of the disclosure.

What is claimed is:

1. A moving part of a compressor, the moving part comprising:
   a base material having a polished surface and including a steel material;
   an adhesive layer arranged on the polished surface; and
   a coating layer including diamond-like carbon;

wherein,
the adhesive layer is arranged between the base material and the coating layer and bonds the coating layer to the base material,
the base material includes an etching-processed area having a plurality of microgrooves (MG) extending in a downward direction into the base material from the polished surface, and
the plurality of microgrooves extend under the adhesive layer, and penetrating into the etching-processed area.

2. The moving part of claim 1, wherein a depth of the microgrooves ranges from 10 nm to 200 nm.

3. The moving part of claim 1, wherein a wettability of the polished surface having the etching-process area has different characteristics than a wettability of a polished surface of the base material that does not include the etching-processed area.

4. The moving part of claim 1, wherein,
the base material includes stainless steel (SUS),
a centerline average roughness (Ra) of the polished surface ranges from 0.03 µm to 0.1 µm, and
a ten point average roughness (Rz) of the polished surface ranges from 0.3 µm to 2.0 µm.

5. The moving part of claim 1, wherein the coating layer further includes silicon.

6. The moving part of claim 5, wherein a concentration of the silicon in the coating layer is less than or equal to 5% such that an average friction coefficient of the coating layer is less than or equal to 0.06 in a section where a reciprocating friction number of the coating layer is less than or equal to 140,000.

7. The moving part of claim 6, wherein the concentration of the silicon in the coating layer is less than or equal to 3% such that a fluctuation range of a friction coefficient of the coating layer is less than or equal to 0.03.

8. The moving part of claim 1, wherein the coating layer includes at least one of chrome (Cr) or iron (Fe).

9. The moving part of claim 1, wherein a thickness of the adhesive layer is less than a thickness of the coating layer.

10. The moving part of claim 1, wherein,
a thickness of the coating layer is 1.0 µm to 3.0 µm, and
a thickness of the adhesive layer is 0.3 µm to 0.9 µm.

11. The moving part of claim 1, wherein a hardness of the adhesive layer is less than each of a hardness of the base material and a hardness of the coating layer.

12. A compressor comprising:
a compressing portion configured to compress a fluid and including a moving part which causes repetitive friction with at least one other component;
a driving motor configured to drive the compressing portion; and
a housing accommodating the compressing portion and the driving motor,
wherein the moving part comprises:
a base material having a polished surface and including a steel material;
an adhesive layer arranged on the polished surface; and
a coating layer including diamond-like carbon;
wherein,
the adhesive layer is arranged between the base material and the coating layer and bonds the coating layer to the base material,
the base material includes an etching-processed area having a plurality of microgrooves (MG) extending in a downward direction into the base material from the polished surface, and
the plurality of microgrooves extend under the adhesive layer, and penetrating into the etching-processed area.

13. A method of manufacturing a moving part, the method comprising:
forming a polished surface by polishing a surface of a base material including a steel material;
forming an etching-processed area including a plurality of microgrooves extending in a downward direction into the base material from the polished surface by performing an etching process on the polished surface;
forming an adhesive layer on the etching-processed area so that the plurality of microgrooves extend under the adhesive layer, penetrating down into the etching-processed area; and
forming a coating layer including diamond-like carbon on the adhesive layer.

14. The method of claim 13, wherein,
the base material includes stainless steel (SUS),
a centerline average roughness (Ra) of the polished surface ranges from 0.03 µm to 0.1 µm, and
a ten point average roughness (Rz) of the polished surface ranges from 0.3 µm to 2.0 µm.

15. The method of claim 13, wherein the forming of the etching-processed area comprises:
generating plasma by injecting argon gas into a chamber containing the base material and applying a certain voltage into the chamber; and
forming a plurality of microgrooves having a depth of 10 nm to 200 nm from the polished surface of the base material by performing the etching process on the polished surface by the plasma.

16. The method of claim 13, wherein the forming of the adhesive layer comprises depositing at least one metal material including at least one of chrome or iron on the etching-processed area.

17. The method of claim 13, wherein the forming of the coating layer comprises ionizing a hydrocarbon gas by plasma discharge to form the coating layer on the surface of the adhesive layer.

18. The method of claim 13, wherein the forming of the coating layer comprises forming the coating layer including diamond-like carbon and silicon on a surface of the adhesive layer by adding silicon.

19. The method of claim 13, wherein, in the forming of the coating layer, a process temperature is greater than or equal to 100° C. and less than or equal to 300° C.

20. The method of claim 18, wherein a concentration of the silicon in the coating layer is less than or equal to 3%.

* * * * *